United States Patent
Khojasteh et al.

(10) Patent No.: US 7,183,036 B2
(45) Date of Patent: Feb. 27, 2007

(54) LOW ACTIVATION ENERGY POSITIVE RESIST

(75) Inventors: Mahmoud Khojasteh, Poughkeepsie, NY (US); Kuang-Jung Chen, Poughkeepsie, NY (US); Pushkara Rao Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 10/987,530

(22) Filed: Nov. 12, 2004

(65) Prior Publication Data

US 2006/0105266 A1    May 18, 2006

(51) Int. Cl.
*G03F 7/039* (2006.01)
*G03F 7/40* (2006.01)

(52) U.S. Cl. .................. 430/270.1; 430/315; 430/324; 430/323; 430/317; 430/313; 430/318; 430/275.1; 430/271.1; 430/272.1

(58) Field of Classification Search .............. None
See application file for complete search history.

(56) References Cited

U.S. PATENT DOCUMENTS

| | | | |
|---|---|---|---|
| 4,855,017 A | | 8/1989 | Douglas |
| 5,077,174 A | * | 12/1991 | Bauer et al. ............ 430/270.1 |
| 5,225,316 A | * | 7/1993 | Vogel et al. ............ 430/270.1 |
| 5,362,663 A | | 11/1994 | Bronner et al. |
| 5,429,710 A | | 7/1995 | Akiba et al. |
| 5,562,801 A | | 10/1996 | Nulty |
| 5,618,751 A | | 4/1997 | Golden et al. |
| 5,744,376 A | | 4/1998 | Chan et al. |
| 5,801,094 A | | 9/1998 | Yew et al. |
| 5,821,469 A | | 10/1998 | Shanmugham |
| 6,146,811 A | * | 11/2000 | Kim et al. ............ 430/270.1 |
| 6,238,842 B1 | * | 5/2001 | Sato et al. ............ 430/281.1 |

FOREIGN PATENT DOCUMENTS

| | | |
|---|---|---|
| EP | 0 829 766 A2 * | 3/1999 |
| WO | WO-03/067332 A2 * | 8/2003 |

OTHER PUBLICATIONS

Kang et al, "Measuring and Simulating Postexposure Bake Temperature Effects in Chemically Amplified Photoresists", Advances in Resist Technology and Processing XIX, Fedynyshyn, ed, Proceedings of SPIE, fol. 4690 (2002) pp. 963-970.*
Yamana et al , "Deblocking Reaction of Chemically Amplified ArF Positive Resists", vol. 3333—Advances in Resist Technology and Processing XV Will Conley, Editor Jun. 1998,SPIE, vol. 333, pp. 32-42.*
www.cornell.edu/pages/jf262/Conversion_Factors.htm, 3 pages, no date.*
Kim et al,"Chemically amplfied resists based on acrylate polymers containing ketal groups in the side chains", Part of the SPIE Conference on Advances in Resist TEchnology and Processing XVK, Santa Clara, California, Mar. 1999, SPIE vol. 3678, pp. 625-632.*
Vohra et al,"Highly transparent Resist Platforms for 157 nm Microlithography: An Update", Advances in Resist Technology and processing XIX, Theodore H. Fedynyshyn, ed, Proceedings of SPIE, vol. 4690 (2002.0 pp. 84-93.*

* cited by examiner

*Primary Examiner*—Cynthia Hamilton
(74) *Attorney, Agent, or Firm*—Steven Capella

(57) ABSTRACT

Acid-catalyzed positive resist compositions which are imageable with 193 nm radiation (and possibly other radiation) at low energy levels are obtained using a polymer having acrylate/methacrylate monomeric units comprising a low activation energy moiety preferably attached to a naphthalene ester group. The resist allows the performance benefit of acrylate/methacrylate polymers with low activation energy for imaging thereby enabling improved resolution and reduced post-exposure bake sensitivity. The resist polymer also preferably contains monomeric units comprising fluoroalcohol moiety and a monomeric units comprising a lactone moiety.

20 Claims, No Drawings

LOW ACTIVATION ENERGY POSITIVE RESIST

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

The ability to produce smaller devices is limited by the ability of lithographic techniques to reliably resolve smaller features and spacings. The nature of optics is such that the ability to obtain finer resolution is limited in part by the wavelength of light (or other radiation) used to create the lithographic pattern. Thus, there has been a continual trend toward use of shorter light wavelengths for lithographic processes. Recently, the lithography using 193 nm imaging radiation has become more widespread for producing small features.

A resist composition must possess desirable optical properties to enable image resolution at a desired radiation wavelength as well as suitable chemical and mechanical properties to enable transfer to the image from the patterned resist to an underlying substrate layer(s). Thus, a patternwise exposed positive resist must be capable of appropriate dissolution response (i.e. selective dissolution of exposed areas) to yield the desired resist structure. Given the extensive experience in the lithographic arts with the use of aqueous alkaline developers, it is important to achieve appropriate dissolution behavior in such commonly used developer solutions. The patterned resist structure (after development) must be sufficiently resistant to enable transfer of the pattern to the underlying layer(s). Typically, pattern transfer is performed by some form of wet chemical etching or ion etching.

In the past, it was thought that 193 nm lithography would be succeeded by 157 nm lithography in order to reach the 45 nm critical dimension node. Recently, however, the lithography roadmap has been altered by the proposed use of 193 nm immersion lithography which promises to extend 193 nm lithography to the 45 nm node and perhaps beyond.

While some resist compositions have been designed for use in conventional 193 nm lithography, there is a need for improved resists that are capable of imaging features at critical dimensions of 50 nm or less across large (300 mm) wafers. Acrylate/methacrylate resists have been the most widely accepted for use with 193 nm radiation, however these resists generally do not provide adequate critical dimension control across a wafer at critical dimensions below 65 nm. Thus, there is a need for improved acrylate/methacrylate resist compositions useful at the reduced dimensions promised by 193 nm immersion lithography. One contributing factor to lack of critical dimension has been post-exposure bake sensitivity. Thus, there is a desire for acrylate/methacrylate resists with reduced post-exposure bake sensitivity and/or acrylate/methacrylate resists which can be processed without post-exposure bake.

SUMMARY OF THE INVENTION

The invention provides acrylate/methacrylate resist compositions which are capable of high resolution lithographic performance using 193 nm imaging radiation. The resist compositions of the invention possess reduced post-exposure bake sensitivity and/or may be processed without the need for post-exposure bake. The resists of the invention are preferably characterized by the presence of a resist polymer having an acrylate/methacrylate backbone with a low activation energy protecting group pendant from at least one acrylate/methacrylate monomeric unit making up the backbone.

The invention also provides lithographic methods using the resist compositions of the invention to create resist structures and methods using the resist structures to transfer patterns to an underlying layer(s) or portion of a substrate or subsequently deposited overlying layers (e.g., by lift-off). The lithographic methods of the invention are preferably characterized by the use of 193 nm ultraviolet radiation patternwise exposure.

In one aspect, the invention encompasses a resist composition comprising:
(a) an acid-sensitive acrylate and/or methacrylate imaging polymer, and
(b) a radiation-sensitive acid generator,
the imaging polymer comprising:
  i) acrylate and/or methacrylate monomeric units each having a pendant acid-labile moiety that inhibits solubility in aqueous alkaline solutions wherein the acid-labile moiety is labile at low activation energy.

The imaging polymer preferably further contains:
  ii) acrylate and/or methacrylate monomeric units each having a pendant lactone moiety, and
  iii) acrylate and/or methacrylate monomeric units each having a pendant fluoroalcohol moiety.

The lactone moiety is preferably present as a pendant lactone ester.

In another aspect, the invention encompasses a method of forming a patterned material structure on a substrate and/or patterning a portion of a substrate, the method comprising:
(A) providing a substrate with a layer of the material to be patterned or a substrate with a portion to be patterned,
(B) applying a resist composition to the substrate to form a resist layer on the substrate, the resist composition of the invention;
(C) patternwise exposing the substrate to radiation whereby acid is generated by the acid generator in exposed regions of the resist layer by the radiation,
(D) contacting the substrate with an aqueous alkaline developer solution, whereby the exposed regions of the resist layer are selectively dissolved by the developer solution to reveal a patterned resist structure, and
(E) transferring resist structure pattern to the material layer, by etching into the material layer and/or the substrate through spaces in the resist structure pattern.

Preferably, the radiation used in step (B) in the above method is 193 nm ultraviolet radiation. The material to be patterned is preferably selected from the group consisting of organic dielectrics, semiconductors, metals, and ceramics. Alternatively, a material layer may be applied over the patterned resist layer, followed by lifting off the patterned resist to reveal a patterned material layer at spaces in the resist pattern.

These and other aspects of the invention are discussed in further detail below.

DETAILED DESCRIPTION OF THE INVENTION

The invention provides acrylate/methacrylate resist compositions which are capable of high resolution lithographic performance using 193 nm imaging radiation. The resist compositions of the invention possess reduced post-exposure bake sensitivity and/or may be processed without the need for post-exposure bake. The resists of the invention are preferably characterized by the presence resist polymer having an acrylate/methacrylate backbone with a low activation energy protecting group pendant from at least one acrylate/methacrylate monomeric unit making up the backbone.

The invention also provides lithographic methods using the resist compositions of the invention to create resist structures and methods using the resist structures to transfer patterns to an underlying layer(s) or subsequently deposited overlying layers (e.g., by lift-off). The lithographic methods of the invention are preferably characterized by the use of 193 nm ultraviolet radiation patternwise exposure.

The resist compositions of the invention generally comprise:
(a) an acid-sensitive acrylate and/or methacrylate imaging polymer, and
(b) a radiation-sensitive acid generator,
the imaging polymer comprising:
  i) acrylate and/or methacrylate monomeric units each having a pendant acid-labile moiety that inhibits solubility in aqueous alkaline solutions wherein the acid-labile moiety is labile at low activation energy.

The imaging polymer preferably further contains:
  ii) acrylate and/or methacrylate monomeric units each having a pendant lactone moiety, and
  iii) acrylate and/or methacrylate monomeric units each having a pendant fluoroalcohol moiety.

Acrylate and/or methacrylate monomeric units i) preferably comprise acid labile moieties having an activation energy ($E_a$<20 kcal/mole). Acrylate and/or methacrylate monomeric units i) more preferably have a low activation energy group comprising a low activation energy moiety which is pendant from a naphthalene group which is present as an ester on the acrylate and/or methacrylate monomeric unit. An example of such a methacrylate structure (I) is shown below:

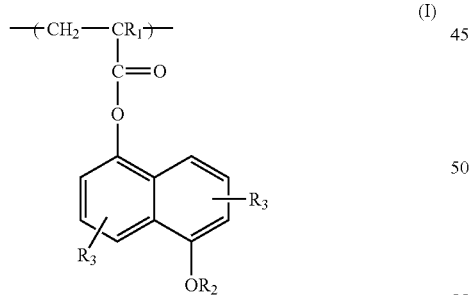
(I)

Where $R_1$ is hydrogen, methyl, F or $CF_3$, $R_2$ is a low activation energy moiety preferably selected from the group consisting of moieties (a), (b) and (c) below:

(a)

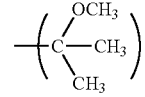
(b)

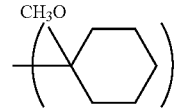
(c)

and $R_3$ represents the various hydrogens on the naphthol double ring one or more of which may be substituted with F or $CF_3$.

The acrylate and/or methacrylate monomeric units ii) each preferably have a pendant lactone moiety as an ester group. An example of such a methacrylate structure (II) is shown below:

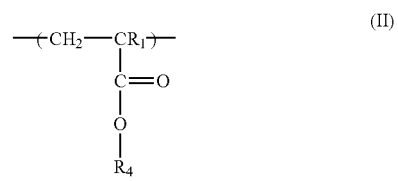
(II)

where $R_1$ is hydrogen, methyl, F or $CF_3$, and $R_4$ is a lactone moiety preferably selected from the group consisting of:

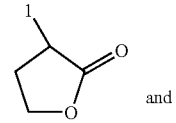
(a)
and

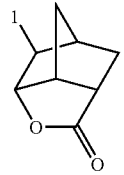
(b)

where 1 indicates the location of the bond to an oxygen of the monomeric unit ii). Other lactones may also be used.

The acrylate and/or methacrylate monomeric units iii) each preferably have a pendant fluoroalcohol moiety. The fluoroalcohol moiety preferably has a $pK_a$ of about 13 or less, more preferably about 10 or less. The fluoroalcohol moiety is preferably a $C_1$–$C_{10}$ fluoroalcohol. Examples of possible fluoroalcohols are hexafluoroisopropanol, trifluoroisopropanol, and trifluoroethanol. If desired, combinations of monomeric units iii) having differing fluoroalcohol moieties may be used. An example of such a methacrylate structure (III) is shown below:

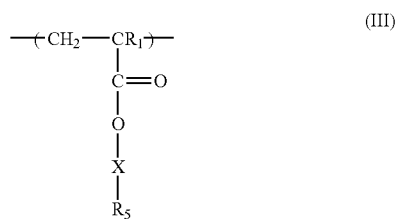

(III)

where $R_1$ is hydrogen, methyl, F or $CF_3$, X is a spacer moiety selected from the group consisting of a linear or branched propylene ($C_3H_6$) group, and $R_5$ is a fluoroalcohol.

For lithographic applications used in the manufacture of integrated circuit structures and other microscopic structures, the imaging polymers of invention preferably comprise at least about 5 mole % of monomeric units i), more preferably about 5–20 mole %, most preferably about 10–20 mole %. The imaging polymers of the invention preferably contain at least about 10 mole % of monomeric units ii), more preferably about 10–30 mole %, most preferably about 15–25 mole %. The imaging polymer preferably contains about 50–85 mole % of monomeric units iii), more preferably about 60–80 mole %, most preferably about 65–75 mole %. The imaging polymer preferably consists essentially of monomeric units i), ii) and iii). The polymers of the invention preferably contain sufficient monomer i) such that the unexposed polymer itself is substantially insoluble in aqueous alkaline developers commonly used in lithographic applications.

In addition to the acrylate/methacrylate polymers, the resist compositions of the invention contain a radiation-sensitive acid generator (PAG). The invention is not limited to the use of any specific acid generator or combination of acid generators; that is, the benefits of the invention may be achieved using various radiation-sensitive acid generators known in the art. Preferred PAG's are those which contain reduced amounts (or preferably zero) aryl moieties. Where aryl-containing acid generator is employed, the absorptive characteristics of the acid generator at 193 nm may restrict the amount of acid generator that can be included in the formulation. Examples of suitable radiation-sensitive acid generators include (but preferably with alkyl substituted for one or more of any indicated aryl moieties) onium salts such as sulfonium and iodonium sulfonates, more particularly exemplified by triaryl sulfonium hexafluoroantimonate, diaryliodonium hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate etc.), substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α-α' bis-sulfonyl diazomethanes, naphthoquinone-4-diazides, alkyl disulfones and others. A preferred acid generator is 4-n-butoxy-1-naphtyltetrahydrothiophenium perfluorooctane sulfonate (BNBS-PFOS).

The resist compositions of the invention will typically contain a solvent prior to their application to the desired substrate. The solvent may be any solvent conventionally used with acid-catalyzed resists which otherwise does not have any excessively adverse impact on the performance of the resist composition. Preferred solvents are propylene glycol monomethyl ether acetate (PGMEA) and cyclohexanone.

The compositions of the invention may further contain minor amounts of auxiliary components such as bulky hydrophobic additives, dyes/sensitizers, base additives, etc. as are known in the art. Preferred base additives are weak bases which scavenge trace acids while not having an excessive impact on the performance of the resist. Preferred base additives are (aliphatic or alicyclic) tertiary alkyl amines, aromatic amines, or t-alkyl ammonium hydroxides such as t-butyl ammonium hydroxide (TBAH).

The resist compositions of the invention preferably contain about 0.1–20 wt. % (more preferably about 0.5–15 wt. %) radiation-sensitive acid generator based on the total weight of imaging polymer in the composition. Where a solvent is present, the overall composition preferably contains about 50–90 wt. % solvent. The composition preferably contains about 1 wt. % or less of the base additive based on the total weight of imaging polymer.

The monomers used in the present invention may be synthesized by known techniques. The invention is not limited to any specific method of synthesizing the polymers used in the invention. Preferably, the polymers are formed by free radical polymerization. The polymers of the invention preferably have a weight average molecular weight of about 5,000–100,000, more preferably about 5,000–25,000.

The resist compositions of the invention can be prepared by combining the imaging polymer, acid generator, and any other desired ingredients using conventional methods. The resist composition to be used in lithographic processes will generally have a significant amount of solvent.

The resist compositions of the invention are especially useful for lithographic processes used in the manufacture of integrated circuits on semiconductor substrates. The compositions are especially useful for lithographic processes using 193 nm UV radiation. Where use of other radiation (e.g. mid-UV, 248 nm deep UV, x-ray, or e-beam) is desired, the compositions of the invention can be adjusted (if necessary) by the addition of an appropriate dye or sensitizer to the composition. The general use of the resist compositions of the invention in lithography for semiconductors is described below.

Semiconductor lithographic applications generally involve transfer of a pattern to a layer of material on the semiconductor substrate or into the substrate itself. Alternatively, a material layer may be patterned by a lift-off technique. The material layer of the semiconductor substrate may be a metal conductor layer, a ceramic insulator layer, a semiconductor layer or other material depending on the stage of the manufacture process and the desired material set for the end product. In many instances, an antireflective coating (ARC) is applied over the material layer or substrate to be patterned before application of the resist layer. The ARC layer may be any conventional ARC which is compatible with acid catalyzed resists.

Typically, the solvent-containing resist composition is applied to the desired semiconductor substrate using spin coating or other technique. The substrate with the resist coating is then preferably heated (pre-exposure baked) to remove the solvent and improve the coherence of the resist layer. The thickness of the applied layer is preferably as thin as possible with the provisos that the thickness is preferably substantially uniform and that the resist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the resist. Preferably, the pre-exposure bake is performed at temperatures which are at least 20° C. below $T_g$.

After solvent removal, the resist layer is then patternwise-exposed to the desired radiation (e.g. 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation, the patternwise exposure is conducted through a mask which is placed over the resist layer. For 193 nm UV radiation, the total exposure energy is preferably about 100 millijoules/cm$^2$ or less, more preferably about 50 millijoules/cm$^2$ or less (e.g. 5–30 millijoules/cm$^2$).

After the desired patternwise exposure, the resist layer is preferably allowed to stabilize. The resist of the invention does not require the use of post-exposure baking. In some instances, it may be desirable to use post-exposure baking. The post-exposure bake is preferably conducted for about 30 seconds to 5 minutes at 40–130° C., more preferably for about 90 seconds at 60° C.

The resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. Preferably, the resist compositions of the invention can be developed with conventional 0.26N aqueous alkaline solutions. The resist compositions of the invention can also be developed using 0.14N or 0.21N or other aqueous alkaline solutions. The resulting resist structure on the substrate is then typically dried to remove any remaining developer solvent. The resist compositions of the invention are generally characterized in that the product resist structures have high etch resistance. In some instances, it may be possible to further enhance the etch resistance of the resist structure by using a post-silylation technique using methods known in the art.

The pattern from the resist structure may then be transferred to the material (e.g., organic dielectric, ceramic, metal or semiconductor) of the underlying substrate or to the underlying substrate itself. Typically, the transfer is achieved by reactive ion etching or some other etching technique. In the context of reactive ion etching, the etch resistance of the resist layer is especially important. Alternatively, a material layer to be patterned may be applied over the patterned resist structure followed by a lift-off step to leave a pattern of material at spaces in the patterned resist structure. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (organic dielectric, ceramic, metal or semiconductor) features generally involve providing a material layer and/or portion of the substrate to be patterned, applying a layer of resist over the material layer or portion, patternwise exposing the resist to radiation, developing the pattern by contacting the exposed resist with a solvent, etching the layer(s) and/or substrate portion underlying the resist layer at spaces in the pattern whereby a patterned material layer and/or substrate portion is formed, and removing any remaining resist from the substrate. In some instances, a hard mask may be used below the resist layer to facilitate transfer of the pattern to a further underlying material layer and/or portion. Alternatively, a material layer may be applied over the patterned resist layer, followed by lifting off the patterned resist to reveal a patterned material layer on the substrate at spaces in the resist pattern. Examples of such processes are disclosed in U.S. Pat. Nos. 4,855,017; 5,362,663; 5,429,710; 5,562,801; 5,618,751; 5,744,376; 5,801,094; and 5,821,469, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

EXAMPLE 1

Hydroxynaphthalene Methacrylate-Containing Terpoylmer Synthesis:

5-hydroxy-1-naphthalenyl methacrylate (a.k.a. hydroxynaphthalene methacrylate or NAMA) monomer (2.60 g, 0.0045 mole), hexafluoroisopropyl methacrylate (iPrHFAMA) monomer (23.20 g, 0.0800 mole), 2-methacryloyl-gamma-butyrolactone (a.k.a. gamma-butyrolactone methacrylate or GBLMA) monomer (3.88 g, 0.0051 mole), azobisisobutyronitrile (AIBN) (0.91 g, 10% the total mole of all monomers), 150 g of tetrahydrofuran (THF) and 72 g of ethylacetate were added to a 250 ml 3-neck round bottom flask equipped with condenser, thermometer, nitrogen inlet and magnetic stirrer bar. The reaction mixture was stirred at room temperature and bubbled with $N_2$ flow for 45 minutes after which is was heated to 67–70° C. and stirred for 14 hours with a blanket $N_2$ flow. After reaction, the solution was then cooled to room temperature and added dropwise to 1200 g of hexane. The resulting slurry was stirred for two hours before filtration. Solid was air dried on the Buckner filter for 1.5 hours, dissolved in acetone (15% wt-wt) and reprecipitated in 1200 g of hexane. The slurry was again stirred for two hours before filtration. The solid was collected and air dried for 2–3 hours before final drying in a vacuum oven at 60° C. overnight. Yield: 90%.

EVE-Protected Terpolymer:

A solution of hydroxynaphthalene methacrylate-containing terpolymer (10.40 g) and PGMEA (93.60 g), 13.50 g of ethylvinylether and 0.56 g of trifluoroacetic acid was added to a 100 ml, 1-neck round bottom flask equipped with condenser and a magnetic bar. The reaction mixture was stirred at room temperature for 6 hours. Then basic $Al_2O_3$ (6.00 g) was added & stirred for another four hours. The solution was filtered and stored on small amount of basic $Al_2O_3$ to be used in resist formulation.

EXAMPLE 2

A terpolymer of ethylvinylether naphthalene methacrylate (NAMA-EVE) GBLMA, and iPrHFAMA with composition mole ratio of Oct. 20, 1970 was dissolved in PGMEA with 5 wt % BNBS-PFOS (based on the total weight of imaging polymer in the composition) and 0.18 wt % 1-t-butyloxycarbonyl 2-phenylbenzimidazole (based on the total weight of imaging polymer in the composition) to make a solution of 10% solid content. The resulting solution was filtered through a 0.2 μm filter. The resist was spin coated on a 8 inch silicon wafer which had a 900 Angstrom thick coating of Shipley's AR40 antireflective coating. The resist was post-apply baked (PAB) at 110° C. for 60 seconds and exposed to 193 nm wavelength light on a ASML 193 nm scanner (0.75 NA) using an alternative phase shift mask (Alt-PSM). The wafer was then developed without post-exposure bake (PEB) using a single-spray puddle develop process for 60 seconds with 0.263 N tetramethyl ammonium hydroxide (TMAH) developer. At dose of 8 mj/cm², 60 nm line on 400 nm pitch feature was resolved.

What is claimed is:

1. A resist composition comprising:
   (a) an acid-sensitive acrylate and/or methacrylate imaging polymer, and
   (b) a radiation-sensitive acid generator,
   the imaging polymer comprising:
     i) acrylate and/or methacrylate monomeric units each having a structure:

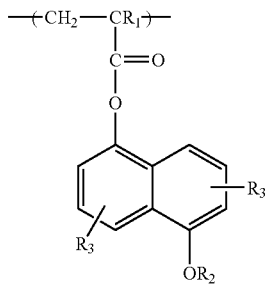

wherein $R_1$ is hydrogen, methyl, F or $CF_3$, $R_2$ is acid-labile moiety having an activation energy ($E_a$) of less than 20 kcal/mole which inhibits solubility in aqueous alkaline solutions, and each $R_3$ is hydrogen, F or $CF_3$.

2. The composition of claim 1 wherein said acid-labile moiety is selected from the group consisting of:

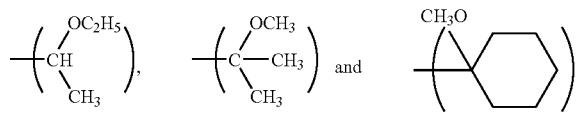

3. The resist composition of claim 1 wherein said imaging polymer further contains:
   ii) acrylate and/or methacrylate monomeric units each having a pendant lactone moiety, and
   iii) acrylate and/or methacrylate monomeric units each having a pendant fluoroalcohol moiety.

4. The resist composition of claim 3 wherein said monomeric units ii) have the structure

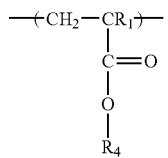

where $R_1$ is hydrogen, methyl, F or $CF_3$ and $R_4$ is a lactone moiety.

5. The resist composition of claim 4 wherein $R_4$ is selected from the group consisting of:

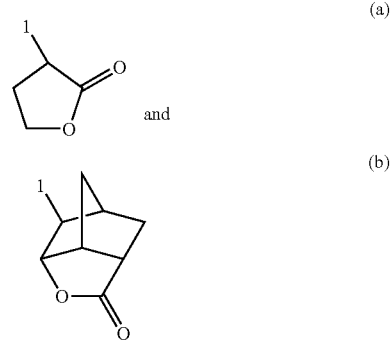

where 1 indicates the location of the bond to an oxygen of the monomeric unit ii).

6. The resist composition of claim 3 wherein said monomeric units iii) have the structure:

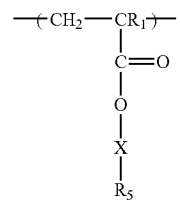

where $R_1$ is hydrogen, methyl, F or $CF_3$, X is selected from the group consisting of linear or branched propylene ($C_3H_6$) groups and $R_5$ is a fluoroalcohol selected from the group consisting of hexafluoroisopropanol, trifluoroisopropanol, and trifluoroethanol.

7. The resist composition of claim 3 wherein said imaging polymer contains about 5–20 mole % of monomeric units i), about 10–30 mole % of monomeric units ii), and about 50–85 mole % of monomeric units iii).

8. The resist composition of claim 1 wherein said composition contains at about 2–15 wt. % of said radiation-sensitive acid generator based on the weight of said imaging polymer.

9. A method of forming a patterned material structure on a substrate and/or patterning a portion of a substrate, said method comprising:
   (A) providing a substrate with a layer of said material to be patterned and/or a substrate with a portion to be patterned,
   (B) applying a resist composition to said substrate to form a resist layer on said substrate, said resist composition comprising (a) an acid-sensitive acrylate and/or methacrylate imaging polymer, and (b) a radiation-sensitive acid generator, the imaging polymer comprising:
     i) acrylate and/or methacrylate monomeric units each having a structure:

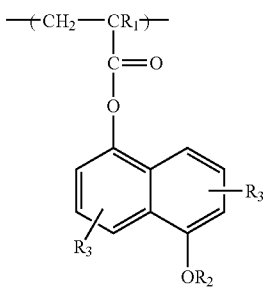

wherein $R_1$ is hydrogen, methyl, F or $CF_3$, $R_2$ is acid-labile moiety having an activation energy ($E_a$) of less than 20 kcal/mole which inhibits solubility in aqueous alkaline solutions, and each $R_3$ is hydrogen, F or $CF_3$, (C) patternwise exposing said substrate to radiation whereby acid is generated by said radiation-sensitive acid generator in exposed regions of said resist layer by said radiation, (D) contacting said substrate with an aqueous alkaline developer solution, whereby said exposed regions of said resist layer are selectively dissolved by said developer solution to reveal a patterned resist structure, and (E) transferring resist structure pattern to said material layer and/or into said substrate, by etching into said material layer and/or said substrate through spaces in said resist structure pattern.

10. The method of claim 9 wherein said material is selected from the group consisting of organic dielectrics, metals, ceramics, and semiconductors.

11. The method of claim 9 wherein said acid-labile moiety is selected from the group consisting of:

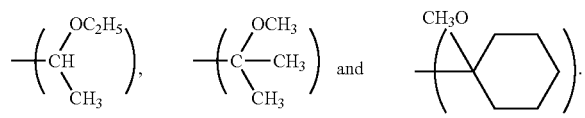

12. The method of claim 9 wherein said imaging polymer further contains:
   ii) acrylate and/or methacrylate monomeric units each having a pendant lactone moiety, and
   iii) acrylate and/or methacrylate monomeric units each having a pendant fluoroalcohol moiety.

13. The method of claim 12 wherein said monomeric units ii) have the structure

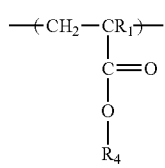

where $R_1$ is hydrogen, methyl, F or $CF_3$ and $R_4$ is a lactone moiety.

14. The method of claim 13 wherein $R_4$ is selected from the group consisting of:

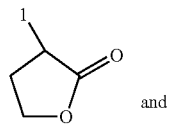

(a)

and

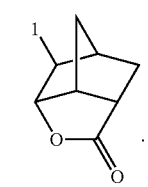

(b)

where 1 indicates the location of the bond to an oxygen of the monomeric unit ii).

15. The method of claim 12 wherein said monomeric units iii) have the structure:

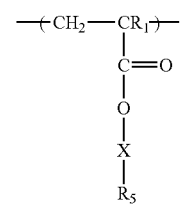

where $R_1$ is hydrogen, methyl, F or $CF_3$, X is selected from the group consisting of linear or branched propylene ($C_3H_6$) groups and $R_5$ is a fluoroalcohol selected from the group consisting of hexafluoroisopropanol, trifluoroisopropanol, and trifluoroethanol.

16. The method of claim 12 wherein said imaging polymer contains about 5–20 mole % of monomeric units i), about 10–30 mole % of monomeric units ii), and about 50–85 mole % of monomeric units iii).

17. The method of claim 9 wherein said etching comprises reactive ion etching.

18. The method of claim 9 wherein at least one intermediate layer is provided between said material layer and said resist layer, and step (E) comprises etching through said intermediate layer.

19. The method of claim 9 wherein said radiation has a wavelength of about 193 nm.

20. A method of forming a patterned material structure on a substrate, said method comprising:
   (A) providing a substrate,
   (B) applying a resist composition to said substrate to form a resist layer on said substrate, said resist composition comprising (a) an acid-sensitive acrylate and/or methacrylate imaging polymer, and (b) a radiation-sensitive acid generator, the imaging polymer comprising:

i) acrylate and/or methacrylate monomeric units each having a structure:

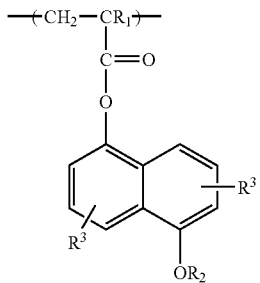

wherein $R_1$ is hydrogen, methyl, F or $CF_3$, $R_2$ is acid-labile moiety having an activation energy ($E_a$) of less than 20 kcal/mole which inhibits solubility in aqueous alkaline solutions, and each $R_3$ is hydrogen, F or $CF_3$, (C) patternwise exposing said substrate to radiation whereby acid is generated by said radiation-sensitive acid generator in exposed regions of said resist layer by said radiation, (D) contacting said substrate with an aqueous alkaline developer solution, whereby said exposed regions of said resist layer are selectively dissolved by said developer solution to reveal a patterned resist structure, (E) applying a material layer over said patterned resist structure on said substrate whereby said material layer contacts said substrate at spaces in said patterned resist structure, and (F) transferring a pattern to said material layer on said substrate by removing said patterned resist and portions of said material layer lying on said resist structure while leaving said material layer on said substrate at said spaces.

* * * * *